(12) United States Patent
Confalonieri

(10) Patent No.: US 7,567,475 B2
(45) Date of Patent: Jul. 28, 2009

(54) MEMORY ARCHITECTURE

(76) Inventor: Emanuele Confalonieri, Via Cascina Baraggia, 1, Lesmo (IT) 20050

( * ) Notice: Subject to any disclaimer, the term of this patent is extended or adjusted under 35 U.S.C. 154(b) by 315 days.

(21) Appl. No.: 11/469,754

(22) Filed: Sep. 1, 2006

(65) Prior Publication Data

US 2007/0103973 A1 May 10, 2007

(30) Foreign Application Priority Data

Sep. 2, 2005 (IT) .......................... MI2005A1628

(51) Int. Cl.
*G11C 7/02* (2006.01)
(52) U.S. Cl. .............................. 365/210.1; 365/185.21; 365/185.19; 365/205
(58) Field of Classification Search ............. 365/210.1, 365/185.21, 185.19, 205
See application file for complete search history.

(56) References Cited

U.S. PATENT DOCUMENTS 7,054,197 B2    5/2006  Vimercati ............. 365/185.18

2002/0101778 A1 *  8/2002  Khan ..................... 365/230.03

\* cited by examiner

*Primary Examiner*—Hoai V Ho
*Assistant Examiner*—Jason Lappas
(74) *Attorney, Agent, or Firm*—Trop, Pruner & Hu, P.C.

(57) ABSTRACT

A memory architecture includes a matrix of memory cells structured into rows and columns and associated with a row decoder, an array of reference cells associated with the matrix, a first detector block including plural sense amplifiers associated with the matrix in correspondence with its columns, and a plurality of latch registers connected to the output of the sense amplifiers and interconnected to each other by a references bus which further connects them to a second detector block that includes at least one sense amplifier of the reference cells. The array of reference cells is placed upstream of the wordlines of the matrix taking, as reference, a propagation direction of a voltage signal applied to the memory cells. Moreover, the second detector block includes a stabilized buffer suitable to supply the references bus with an output signal having rise transient stable with respect to working conditions of the architecture.

23 Claims, 14 Drawing Sheets

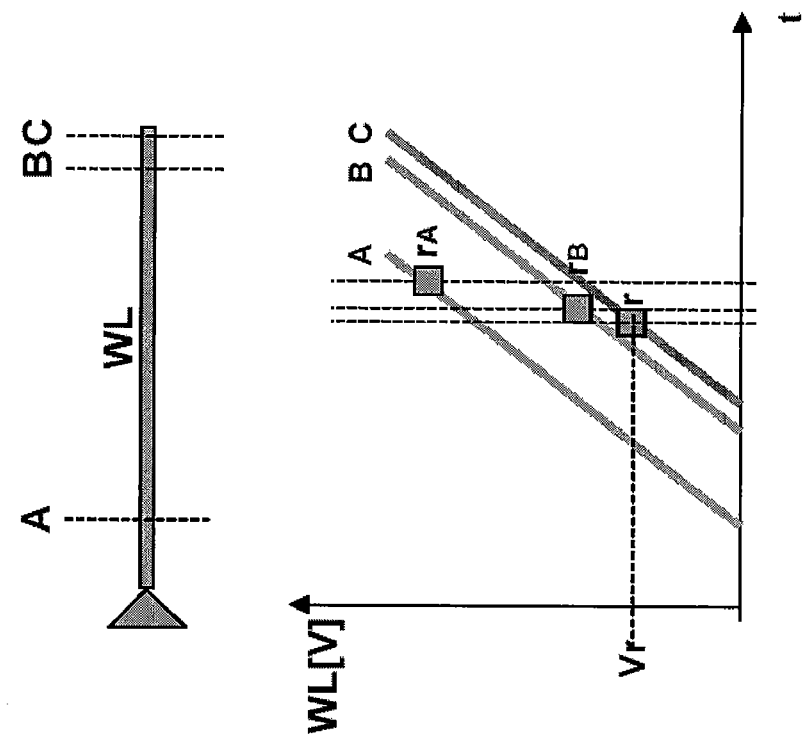
FIG. 5B
FIG. 5A
FIG. 5C
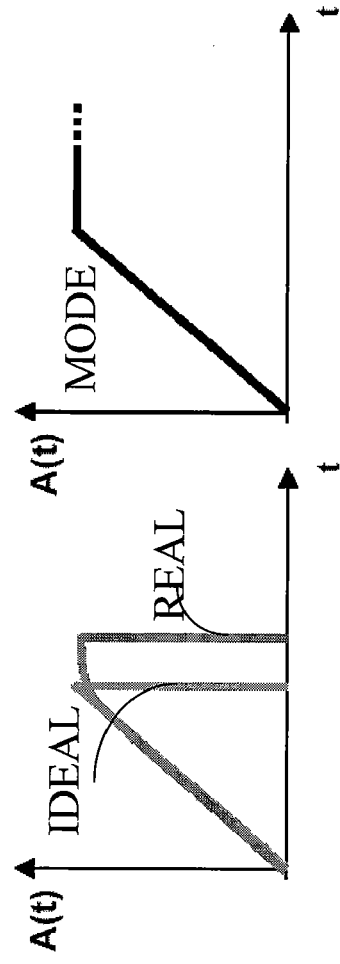
FIG. 4B
FIG. 4A

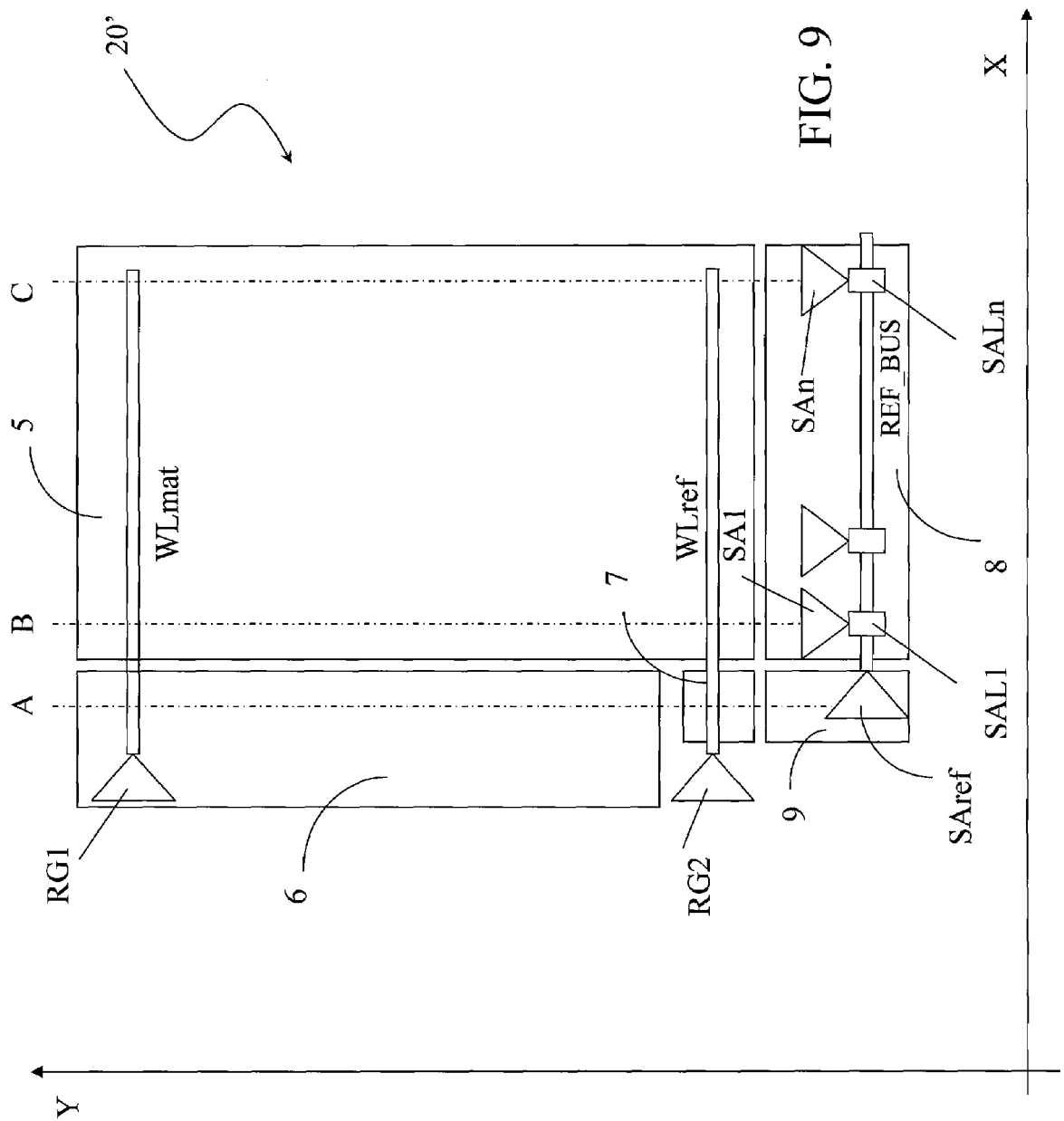

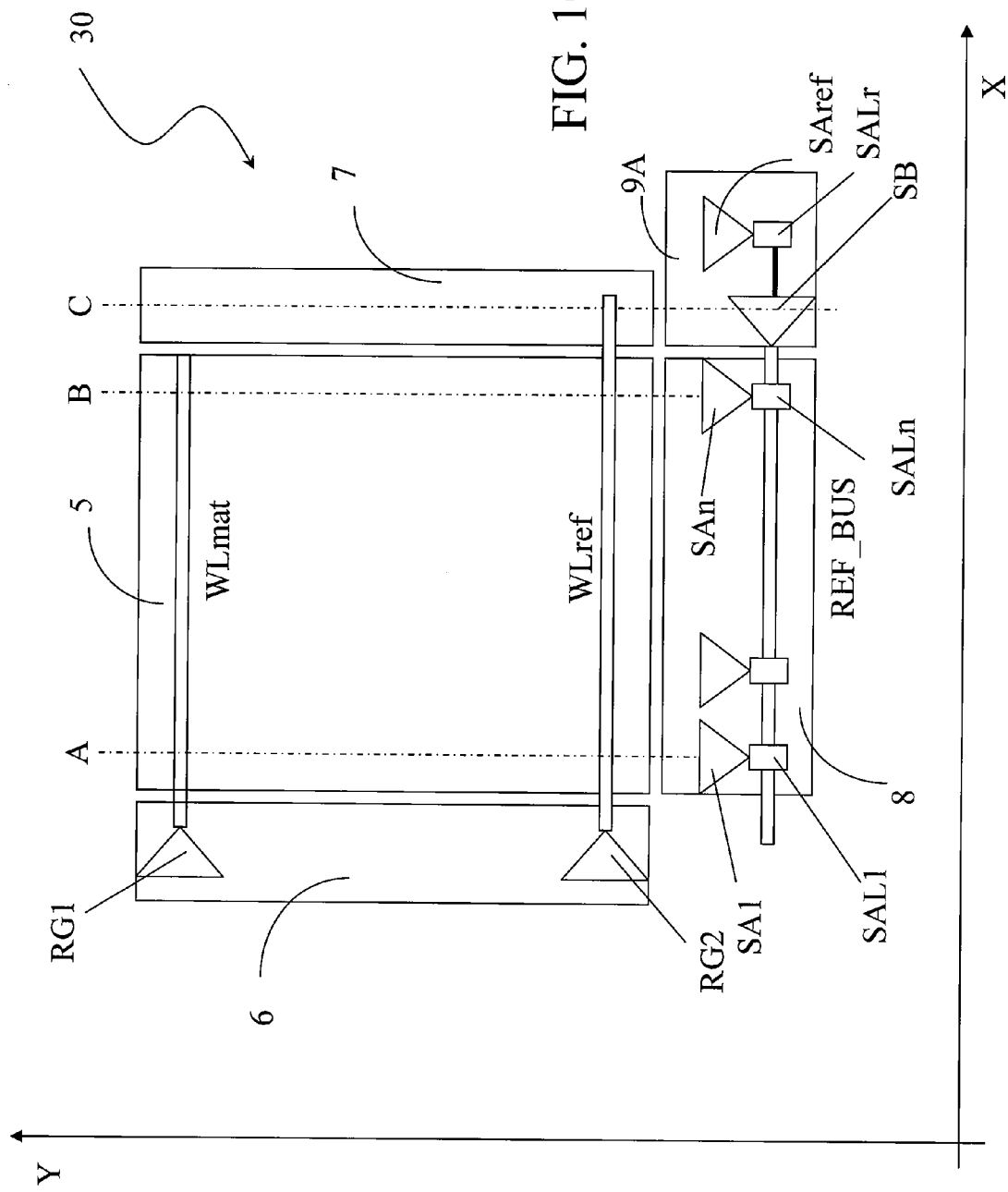

MEMORY ARCHITECTURE

BACKGROUND OF THE INVENTION

1. Field of the Invention

The present invention relates to a memory architecture.

The invention particularly, but not exclusively, relates to a memory architecture of the FLASH-NOR type using a so called ramp reading method and the following description is made with reference to this field of application by way of illustration only.

2. Description of the Related Art

As it is well known, a new reading method has been recently proposed for FLASH-NOR memories called "ramp reading method".

This reading method and the corresponding memory device is described for example in U.S. Pat. No. 7,054,197.

The reading method described in this document provides to apply, in a reading step, a same voltage linear ramp both on the word lines WL of the matrix cells of the memory device and on the word lines WL of the corresponding reference cells. As it is well known, in memory cell matrixes the word lines WL connect the gate terminals of the cells.

The method thus comprises a comparison step between a time instant in which a given matrix cell reaches a predetermined drain current and a time instant in which a given reference cell reaches the same drain current.

In practice, the matrix cell read and the reference cell are compared not through the current absorbed by them but through their threshold voltage.

The principle scheme of the ramp reading method described in the above cited U.S. patent application is reported in FIG. 1.

In particular, in this figure, a generic matrix cell 1 with MOS transistor has a source terminal connected to a source line SL and a drain terminal connected to a bitline BL. Moreover, the MOS transistor has a control terminal connected to a wordline WL, which receives a voltage ramp.

The bitline BL is also connected to a first input terminal, in particular an inverting input terminal (−), of a precharge I/V converter 2 having a second input terminal, in particular a non-inverting input terminal (+), receiving a reference voltage VREF and an output terminal OUT1 connected to a first input terminal, in particular a non-inverting input terminal (+), of a comparator 3.

The bitline BL is further connected, by a current mirror 4, to a reference current generator IREF, the current mirror 4 being in turn connected to a first voltage reference, in particular a supply voltage reference Vcc and the reference current generator IREF being in turn connected to a second voltage reference, in particular a ground GND.

The comparator 3 comprises a second input terminal, in particular an inverting input terminal (−), connected to the first input terminal of the precharge I/V converter 2, as well as an output terminal OUT2 connected to a bank of latch registers LT. Moreover, the input terminals of the comparator 3 are connected to each other by a resistive element R0.

Finally, the latch registers LT are connected to a references bus REF_BUS and output a value CV corresponding to the logic value of the cell 1 as read.

A particular memory partition architecture, as schematically shown in FIG. 2 and globally indicated with 10, corresponds to this ramp reading method.

The architecture 10 comprises a matrix 5 of memory cells, in particular multilevel cells.

It is remembered that the reading and verify of the content of multilevel cells use at least one first R1, one second R2 and one third read reference R3, as well as one first P1, one second P2 and one third programming reference P3, together with a deplete state verify reference DV and an erase verify reference EV, as schematically shown in FIG. 3.

The matrix 5 is then connected to a row decoder 6 arranged along a first side of the matrix 5 of the memory cells and an array 7 of reference cells arranged along a second side of the matrix 5 of memory cells, opposed to the first side.

In particular, the row decoder 6 comprises at least one first ramp generator RG1 connected to the cells of the matrix 5 by means of a matrix wordline WLmat, as well as a second ramp generator RG2 connected to the array 7 of reference cells by means of a reference wordline WLref.

The architecture 10 also comprises a first detector block 8, arranged along a third side of the matrix 5 of memory cells, this third side being perpendicular to the first and to the second side of the matrix 5. The detector block 8 comprises, in particular, a plurality of sense amplifiers SA1 . . . SAn connected at the input to the cells of the matrix 5 and at the output to a plurality of latch registers SAL1 . . . SALn.

The latch registers SAL1 . . . SALn are connected to each other by a third references bus REF_BUS, which further connects them also to a reference sense amplifier SAref comprised into a second detector block 9. The second detector block 9 is placed next to the first detector block 8 in correspondence with the second side of the matrix 5 of memory cells.

It is to be noted that, a first dimension X corresponding to the extension direction of the rows of the matrix 5 and a second direction Y corresponding to the extension direction of the columns of the matrix 5 being defined, it results that:

the row decoder 6 and the array 7 of reference cells have sizes comparable to the one of the matrix 5 of memory cells in the second direction Y;

the first detector block 8 has a size comparable to the one of the matrix 5 of memory cells in the first direction X;

the second detector block 9 has a size comparable to the one of the array 7 of reference cells in the first direction X; and the first detector block 8 has a size comparable to the one of the second detector block 9 in the second direction Y.

The ramp reading method described in the U.S. patent application above indicated and implemented by the architecture 10 shown in FIG. 2 shows many advantages, but, being of the dynamic type, introduces a series of new and non-negligible problems.

In particular, in the case of multilevel memory cells, where the application of the voltage ramp reading method is particularly indicated, the control of the threshold voltage values of the reference used in reading and verify is problematic.

Further problems can be summarized in:

superfluous time in reading;

variability of the access time in reading; and mismatch between verify voltage ramp and reading voltage ramp.

The accuracy of the memory device in reading and verify as well as its stability with respect to the working conditions in which the memory device must ensure a correct operation are also of particular interest.

In particular, the accuracy of the memory device generally depends on the supply voltage and on the working temperature of the device itself.

It is also important to consider that erasing, programming and reading operations of a given memory portion are carried out at different times and can thus be carried out under different working conditions.

In general, the prior art thus needs to define voltage margins between the various distributions on the basis of the worse case, which typically consists in programming at a certain temperature/voltage and reading at another temperature/voltage.

BRIEF SUMMARY OF THE INVENTION

An embodiment of the present invention is directed to an architecture of a non-volatile memory device with voltage ramp reading, in particular for multilevel memory cells, having such structural and functional characteristics as to allow to overcome the limits and drawbacks still affecting the architectures realized according to the prior art.

The architecture comprised an array of the reference cells which is placed next to the corresponding ramp generator. In this way, the propagation times of the biasing signal are drastically reduced and a further improvement in the architecture compaction is obtained.

Another embodiment of the present invention is directed to a memory architecture of the type comprising:
- at least one matrix of memory cells structured into rows and columns of cells and associated with a row decoder;
- an array of reference cells associated with the matrix on the side of the rows;
- a first detector block for the matrix cells comprising a plurality of sense amplifiers associated with the matrix on the side of the columns, as well as a plurality of latch registers connected to the output of the sense amplifiers and interconnected to each other by a references bus which further connects them to a second detector block for the reference cells in turn including at least one sense amplifier of reference cells, wherein the array of reference cells is placed upstream of the matrix wordlines taking, as reference, a propagation direction of a voltage signal applied to the memory cells.

Yet another embodiment of the present invention is directed to a memory architecture of the type wherein the second detector block further comprises a stabilized buffer connected to the references bus and suitable to supply it with an output signal with rise transient being stable with respect to the architecture working conditions.

Finally, a further embodiment of the present invention is directed to a memory architecture of the type wherein the first detector block for the matrix cells comprises a plurality of latch registers controlled by the references bus.

The characteristics and the advantages of the architecture according to the embodiments of the present invention will be apparent from the following description of an embodiment thereof given by way of indicative and non-limiting example with reference to the annexed drawings.

BRIEF DESCRIPTION OF THE SEVERAL VIEWS OF THE DRAWINGS

FIGS. 4A and 4B show the pattern of inner signals of the architecture of FIG. 2 and the corresponding points of this architecture, respectively;

FIGS. 5A-5C show schemes of voltage ramps applied to a word line of a memory device and a block scheme of an RC network model;

FIG. 9 schematically shows a first embodiment of the architecture of FIG. 8;

FIG. 10 schematically shows a second embodiment of the architecture of FIG. 8;

DETAILED DESCRIPTION OF THE INVENTION

Figure 8:
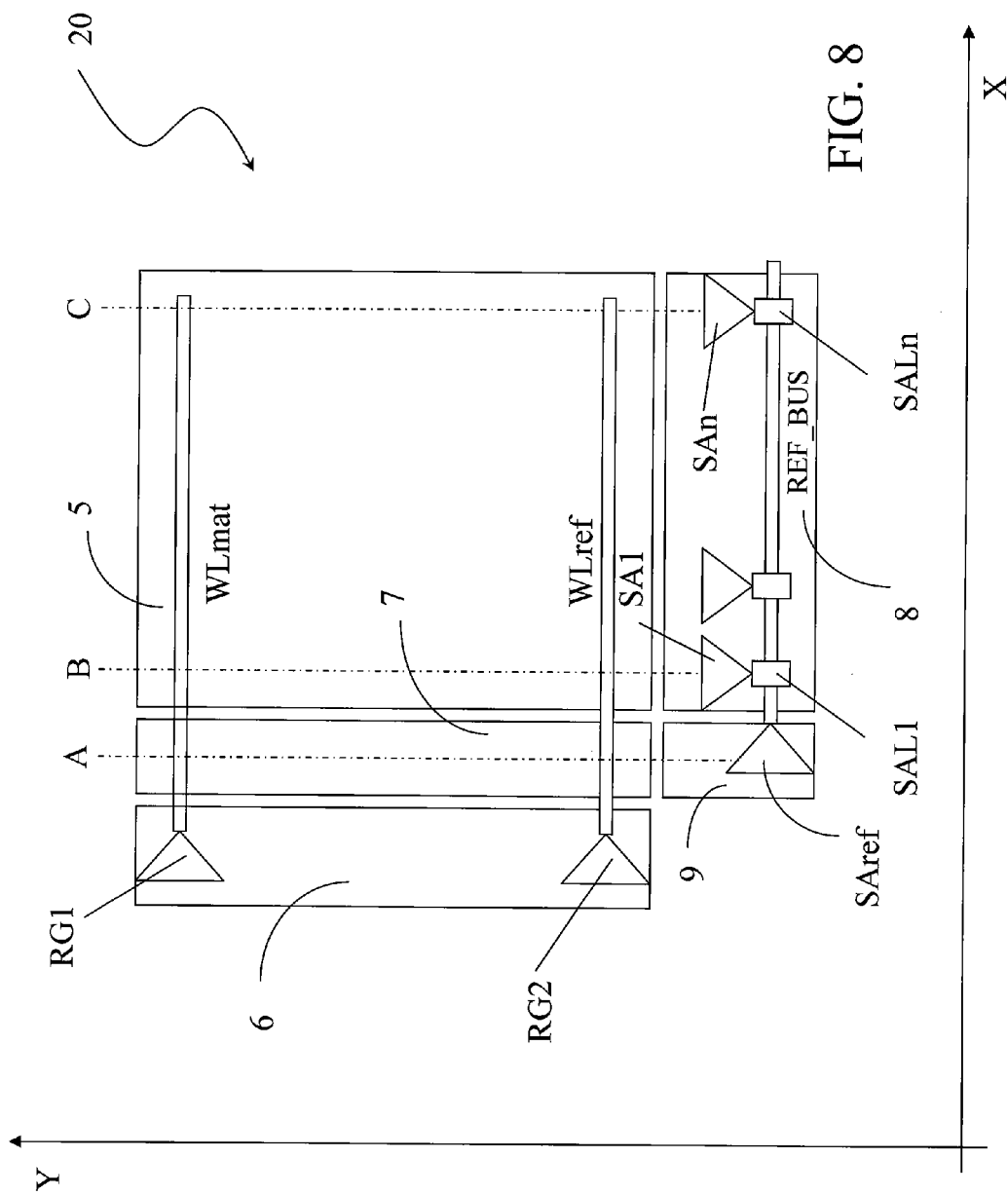
FIG. 8 schematically shows an architecture of a non-volatile memory device with voltage ramp reading according to an embodiment of the present invention.

With particular reference to the example of FIG. 8, a memory architecture incorporating a matrix of multilevel memory cells connected to a row decoder and to an array of reference cells is schematically and globally indicated with 20.

Elements being structurally and functionally identical to those described with reference to the prior art will be given the same reference numbers for simplifying the illustration only.

In particular, the architecture 20 comprises a first detector block 8 including a plurality of sense amplifiers SA1 . . . SAn connected at the input to the cells of the matrix 5 of multilevel memory cells and at the output to a plurality of latch registers SAL1 . . . SALn.

Moreover, the row decoder 6 comprises at least one first ramp generator RG1 connected to the cells of the matrix 5 by a matrix word line WLmat, as well as a second ramp generator RG2 connected to the array 7 of reference cells by a reference word line WLref.

The latch registers SAL1 . . . SALn are also connected to each other by a references bus REF_BUS, which connects them also to a reference sense amplifier SAref contained in a second detector block 9.

The first detector block 8 is for the matrix cells, while the second detector block 9 is for the reference cells.

Figure 1:
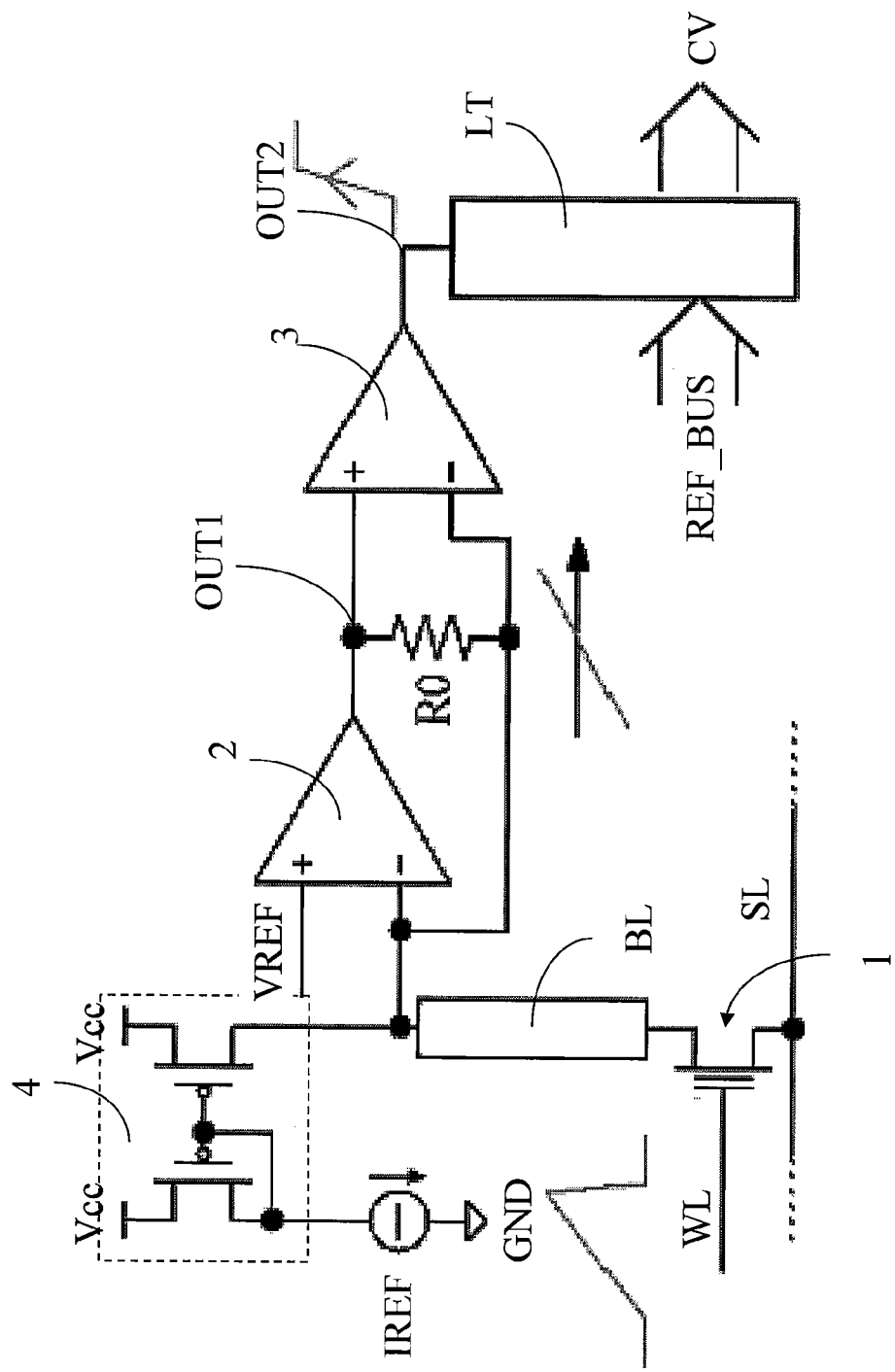
FIG. 1 schematically shows a voltage ramp reading method of a non-volatile memory device realized according to the prior art.
Figure 2:
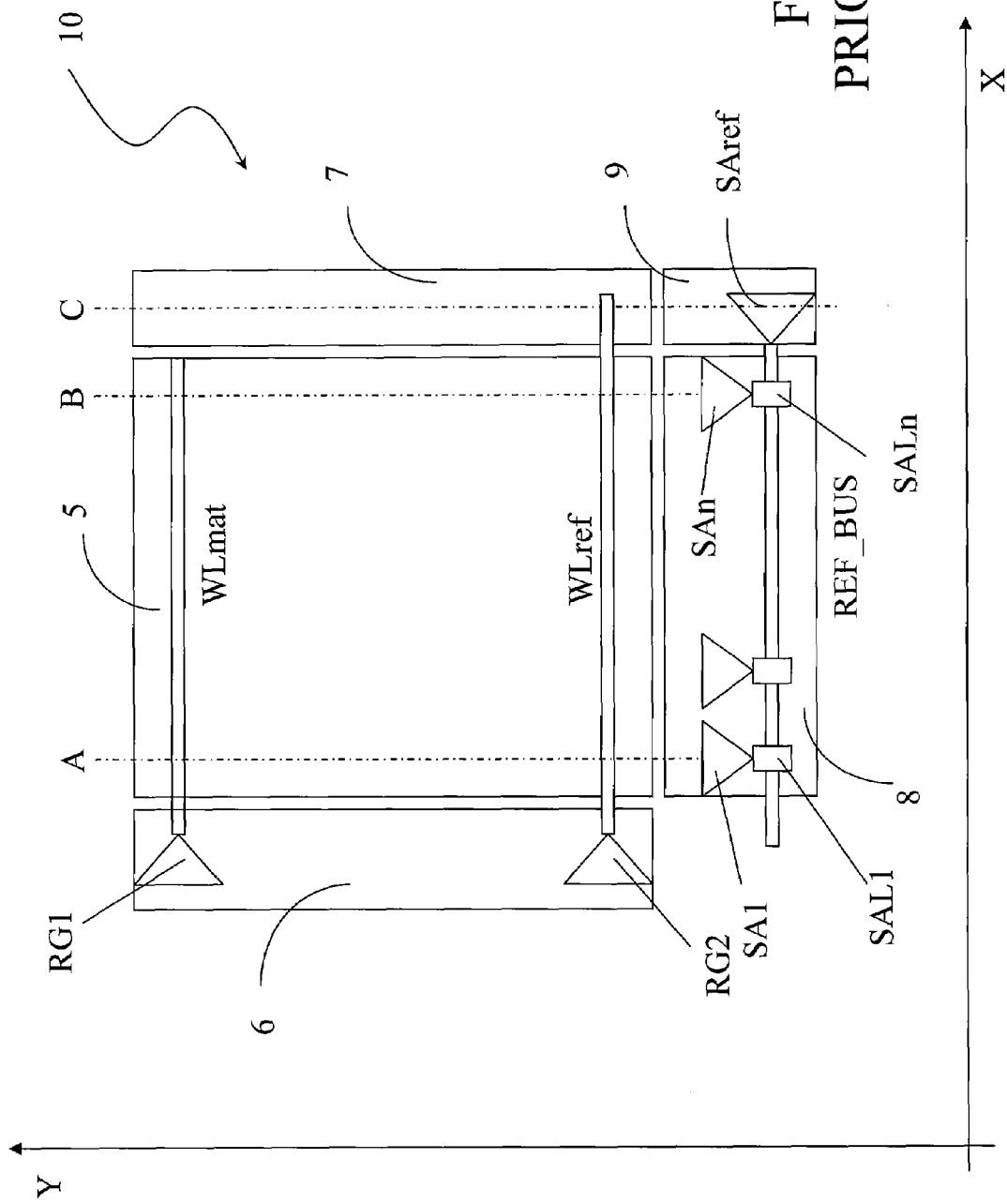
FIG. 2 schematically shows an architecture of a non-volatile memory device suitable to implement the method of FIG. 1.

The inventors have performed a detailed analysis of the problems highlighted by the known memory architecture having the layout previously described and shown in FIG. 2.

The analysis carried out has considered the following points:

a) the transmission time of the voltage ramp along the word line of the matrix 5 of memory cells;

b) the transmission time of the information corresponding to the triggering of the reference to the sense amplifiers SA1 . . . SAn of the first detector block 8; and c) the distortion of the voltage ramp through the word line of the matrix 5 of memory cells.

One embodiment of the invention addresses the following points, hereafter faced in greater detail:

1) superfluous time in reading;
2) control of the threshold voltage of the references;
3) variability of the access time in reading;
4) mismatch between verify voltage ramp and reading voltage ramp; and
5) improvement of the accuracy in reading and verify as well as of the stability with respect to the different working conditions.

Problem 1

Even supposing to apply an ideal voltage ramp, due to the transmission time of this ramp along the word line WL, in the instant in which the ramp has reached the triggering voltage Vri of one Ri of the references R1-R3, the voltage reached by the ramp in correspondence with the reference cell Ri is lower than the desired value Vri, as schematically shown in FIG. 4A where the cells A, B and C indicated in FIG. 2 have been considered.

When the gate voltage on a reference cell Ri has effectively reached a value Vri, the voltage at the start of the word line will be certainly higher.

The triggering of the reference sense amplifier SAref—which occurs in correspondence with the attainment of the voltage Vri by the word line WL in correspondence with the cell "Ri" itself—is then transmitted to the matrix sense amplifiers SA1 . . . SAn, incorporated into the first detector block 8 and uniformly distributed below the matrix 5 of memory cells.

The result is that the reference cell Ri, which has been programmed so as to have a threshold voltage Vri, is "seen" by the various matrix sense amplifiers SA1 . . . SAn as having a higher threshold.

This introduces two transmission time contributions which modify a reference threshold observed by each matrix sense amplifier SA1 . . . SAn.

In particular, FIG. 4A graphically shows the first of these contributions with respect to the cells A-C considered in the architecture 1 of FIG. 2 and reported as reference in FIG. 4B.

It is also evident that the two transmission times just discussed contribute to increase the access time in reading of the matrix 5 of memory cells.

Problem 2

To consider the distortion effect introduced by the word line WL, a voltage ramp has been schematized as a broken line on a diagram voltage vs time, applied to a single pole network RC, as schematically shown in FIGS. 5A-5C.

It is thus immediate to verify that:

$$R(t) = SL \cdot t \cdot u(t); u(t) = 1 \text{ if } t > 0; u(t) = 0 \text{ if } t < 0 \quad (1)$$

$$A(t) = R(t) - R(t - t_Z)$$

$$C(t) = SL \cdot \tau \cdot \left(\frac{t}{\tau} + e^{-t/\tau} - 1\right) \cdot u(t) - SL \cdot \tau \cdot$$

$$\left(\frac{t - t_Z}{\tau} + e^{-(t - t_Z)/\tau} - 1\right) \cdot u(t - t_Z).$$

Figure 6B:
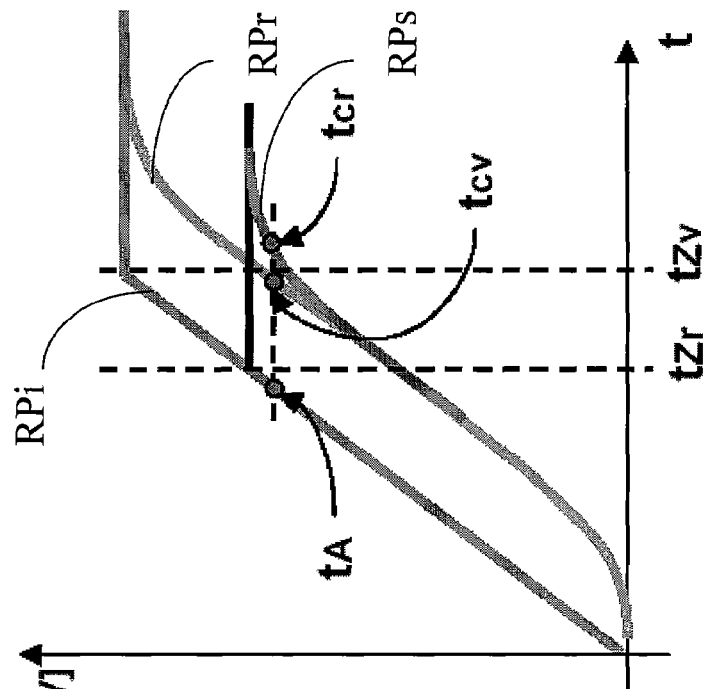
FIGS. 6A and 6B show the pattern of inner signals of the architecture of FIG. 2.
Figure 6A:
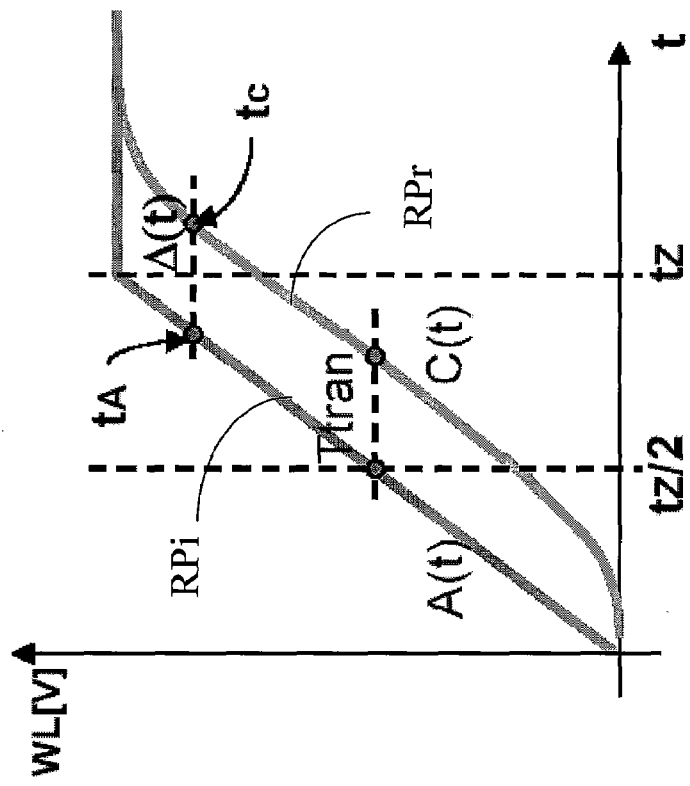

An ideal ramp is then distorted as described by the equations (1) and graphically represented in FIG. 6A, Rpi being the ideal pattern of the voltage ramp and RPr its ideal pattern.

For pole time constants of the word line WL being negligible with respect to the duration of the voltage ramp, it is obtained that the transmission time Ttran is almost equal to the time constant T of the above reported equation (1).

The transmission time in the area influenced by the effect RC of the word line, indicated in FIG. 6A as Δ(t), can be instead approximated as:

$$\Delta(t) = t_c - t_A = \tau \cdot \ln\left(\frac{e^{t_Z/\tau} - 1}{t_Z - t_A} \cdot \tau\right) - t_A. \quad (2)$$

Figure 3:
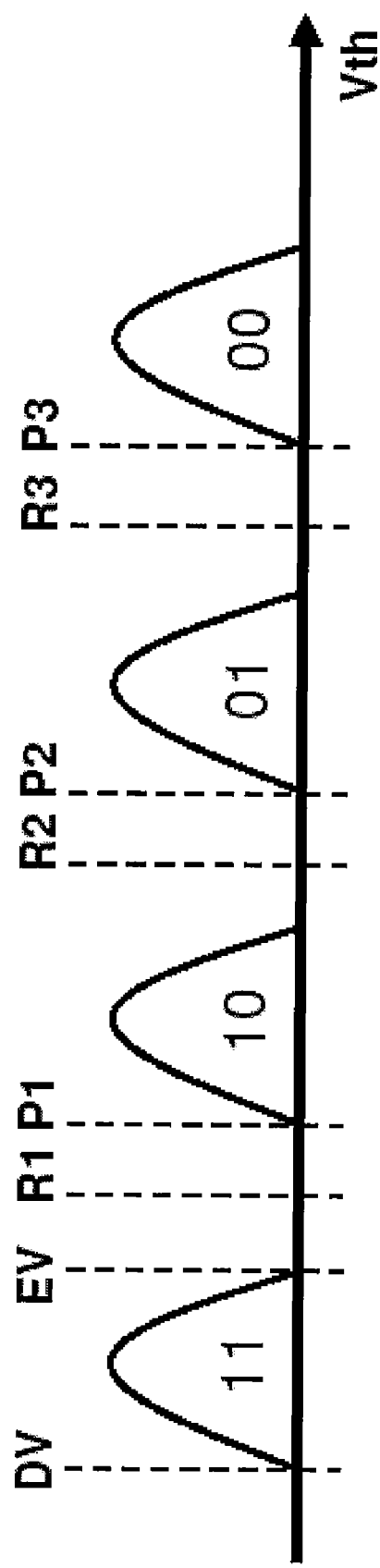
FIG. 3 schematically shows the reading and verify references of the distributions of a multilevel memory cell.

As per what has been previously explained, it is clear that the instant "tc", in which a certain voltage Vc reaches the end of the word line WL (point C in FIGS. 2 and 3B) is delayed with respect to the instant "tA" in which this voltage is at the beginning of the word line WL (point A in FIGS. 2 and 4B), not only by the transmission time Tran, which is well defined, but also by the effects RC of the word line together with the distance of the voltage Vc from the saturation voltage of the voltage ramp.

In particular, the ramp saturation voltage cannot be considered as a parameter exempt from variability, but it depends on the conditions of temperature, supply and on the present active consumes (linked for example to the cycle time of the reading steps).

For this reason, the threshold voltages of the cells arranged at the end of the word line WL are not well defined and their thresholds tend to be near the ramp saturation voltage. This is the case of the third read reference R3 during the reading, or of the third programming reference P3, during the programming verify steps of a device with 2 bits/cell.

Problem 3

A real reading step of the matrix cells 5 ends with the triggering of the third read reference R3, since, according to the ramp reading method, all the cells which have not been triggered yet, in the (corresponding) instant in which the third read reference R3 has been triggered, belong to the level programmed at the highest logic value.

The variability of the triggering of third read reference R3, when the working conditions vary, results in a variability of the access time.

Problem 4

The effect of the non-linearity of the voltage ramp increases the differences between reading voltage ramps and verify voltage ramps.

It is to be remembered that, in a memory device, the reading voltage (saturation voltage of the voltage ramp) is chosen on the basis of various needs, among which certainly that of ensuring a window of voltages sufficient to host the programmed levels, but also to ensure the reliability of the memory device and thus the reduction of the stress effects on the cells, and still to ensure low consumes under stand-by conditions.

These latter requests tend to force the use of not too high reading voltages.

During the verify operations, in particular in the programming verify steps, the voltage is higher so as to cover a wider window, thus comprising the verify reference of the last programmed level, i.e. of the third programming reference P3. Thus, a reading ramp and a verify ramp with different saturation voltages are obtained.

Starting from this state of things and by applying the results of the previous analysis on the ramp distortion, according to the hypotheses: $t_C^{Read} > t_Z^{Read}; t_C^{Verify} < t_Z^{Verify}; t_Z^{Read} < t_Z^{Verify}; t_Z^{Verify} >> \tau$ the following result is obtained, schematically shown in FIG. 6B:

$$\Gamma(t_A) = t_C^{Read} - t_C^{Verify} \cong \tau \cdot \left[ \ln\left( \frac{e^{t_Z^{Read}/\tau} - 1}{t_Z^{Read} - t_A} \cdot \tau \right) - 1 \right] + t_A \quad (3)$$

$$\Delta V(t_A) = SL \cdot \Gamma(t_A).$$

Figure 7:
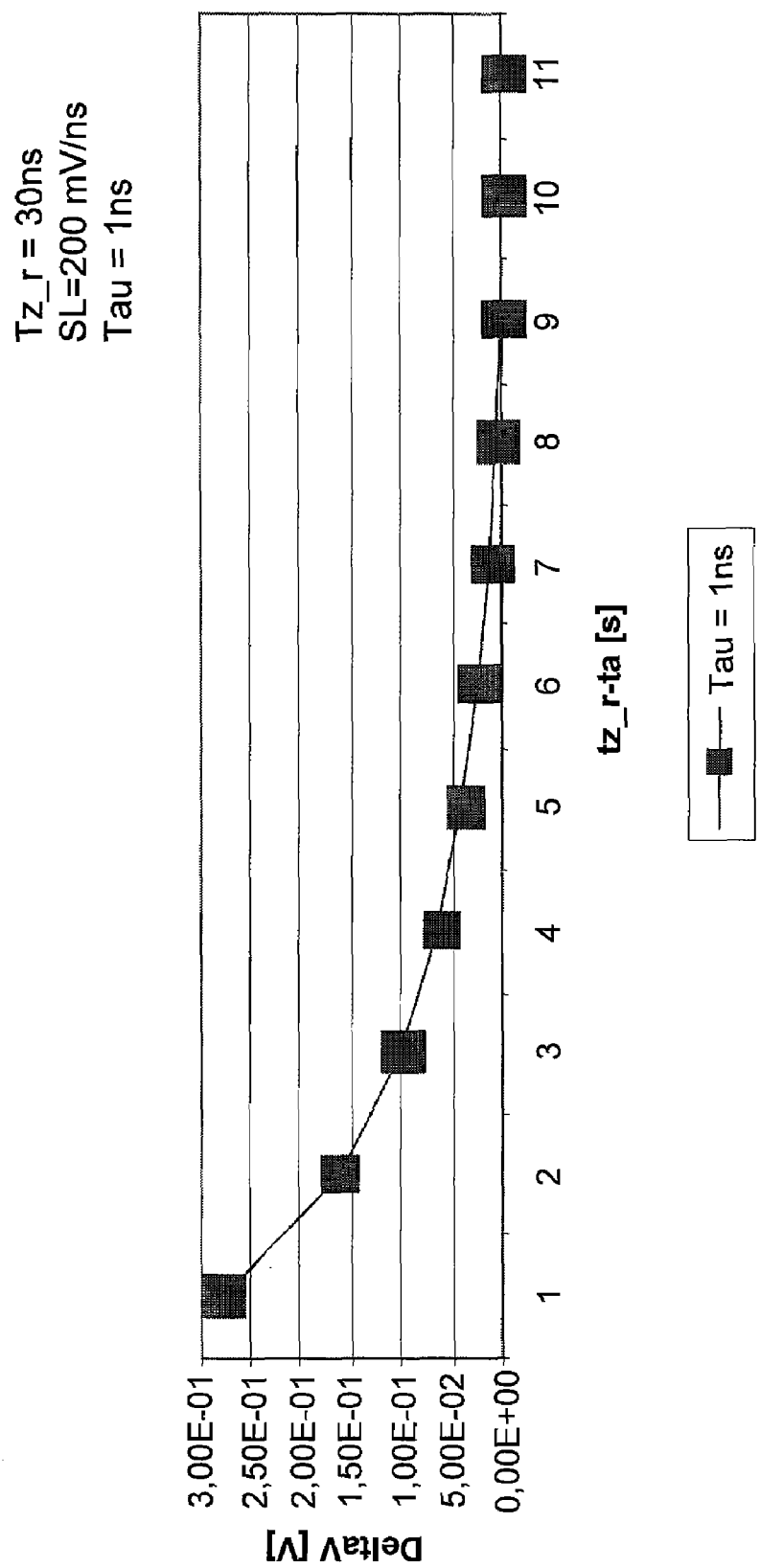
FIG. 7 schematically shows the results of a simulation carried out by the Applicant.

In other words, a variation in the voltage occurs in the observed threshold of the third read reference R3, due to the mismatch between the two reading and verify voltage ramps. This variation of the threshold voltage shows an increasing progress as long as the distance from the saturation of the voltage ramp reduces, as shown in FIG. 7.

On the basis of the above reported analysis, an architecture of a non-volatile memory device schematically shown in FIG. 8 and globally indicated with 20 has been devised.

As already seen, the architecture 20 comprises the matrix 5 of memory cells connected to the row decoder 6 and to the array 7 of reference cells.

Advantageously according to an embodiment of the invention, the array 7 of reference cells is arranged along a first side of the matrix 5 of memory cells and interposed between this latter and the row decoder 6. In particular, the array 7 of reference cells extends for the whole length of the row decoder 6 in correspondence with the side of the rows of the matrix 5 of memory cells.

The row decoder 6 comprises at least the first ramp generator RG1 connected to the cells of the matrix 5 by means of the matrix wordline WLmat, as well as the second ramp generator RG2 connected to the array 7 of reference cells by means of the reference wordline WLref.

The architecture 20 also comprises the first detector block 8, arranged along a second side of the matrix 5 of memory cells, this second side being perpendicular to the first side of the matrix 5 since the corresponding sense amplifiers are aligned with the columns of the matrix itself. The detector block 8 comprises, in particular, the plurality of sense amplifiers SA1 . . . SAn connected at input to the bitlines of the matrix 5 connected, at the output, to the plurality of latch registers SAL1 . . . SALn.

The latch registers SAL1 . . . SALn are connected to each other by means of the references bus REF_BUS, which connects them also to a reference sense amplifier SAref contained in a second detector block 9. The second detector block 9 is placed next to the first detector block 8 in correspondence with the first side of the matrix 5 and of the array 7 of the reference cells.

In particular, the second detector block 9 has a first side having a dimension substantially identical to the width of the array 7 of reference cells and a second side having a dimension substantially identical to the width of the first detector block 8.

It is to be noted that, once a first dimension X corresponding to the extension direction of the rows of the matrix 5 of memory cells and a second direction Y corresponding to the extension direction of the columns of the matrix 5 of memory cells are defined, it results that:

the row decoder 6 and the array 7 of reference cells have sizes comparable to the one of the matrix 5 of memory cells in the second direction Y;

the first detector block 8 has a size comparable to the one of the matrix 5 of memory cells in the first direction X;

the second detector block 9 has a size comparable to the one of the array 7 of reference cells in the first direction X; and the first detector block 8 has a size comparable to the one of the second detector block 9 in the second direction Y.

Advantageously, the array 7 of reference cells is thus placed next to the second ramp generator RG2, rather than downstream as instead proposed in the prior art.

In substance, the array 7 of reference cells is placed upstream of the wordlines of the matrix 5 of memory cells, taking, as reference, a propagation direction of the voltage signal applied to the memory cells. In particular, the array 7 of reference cells has a first side having a dimension substantially identical to the width of the second detector block 9 and a second side having a dimension substantially identical to the height of the matrix 5 of memory cells.

Thanks to these measures in the layout of the memory architecture 20, these combined advantages are obtained:

1) The voltage ramp on the word line WL and the information of the triggering of the reference sense amplifier SAref move in the same direction.

In this way, the two times compensate themselves, and, ideally, they can be calibrated so as to void each other solving the above exposed problem 1.

2) The references are upstream of the network RC constituted by the word line WL.

In this way, the references "see" an almost ideal ramp, and, thus, they are exempt from the variabilities previously exposed, solving the above exposed problem 2.

3) The switch of the sense amplifier corresponding to the third read reference R3 is not linked to the parasites of the word line WL.

This sense amplifier is thus less sensitive (ideally independent) to the variations of the saturation level of the voltage ramp applied to the word line WL, thus solving the above exposed problem 3.

4) The mismatch between the verify ramp and reading ramp is thus reduced in the case in which the read references and the verify references are placed on the same word line WL, solving the above exposed problem 4. Using two or more word lines for the references, in fact, introduces a variability on the time constant parameter t, which increases the differences between reading and verify voltage ramps.

Moreover, it occurs that an important parameter on the mismatch between verify voltage ramp and reading voltage ramp is the relevance of the time constant t=RC. A reduction of this mismatch can be obtained by using short word lines WL.

In reality, the architecture 20 of FIG. 8, using such a form ratio as to have short rows, would show an area occupied by the array 7 of the reference cells being excessive for some applications.

Having brought the references next to the ramp generator RG1 and a perfect matching of the bitline BL of the references with the matrix bitline BL not being strictly necessary (the voltage ramp reading method is in fact a dynamic reading of the wordline WL not of the bitline BL), a further embodiment of the the invention, schematically shown in FIG. 9 and globally indicated with 20', has been advantageously proposed.

Elements being structurally and functionally identical to those described with reference to the architecture of FIG. 8 will be given the same reference numbers for simplifying the illustration.

The architecture 20' comprises a matrix 5 of memory cells with short rows and an array 7 of reference cells placed at the beginning of the reference wordline WLref, in correspondence with the first side of the matrix 5 of memory cells between the row decoder 6 and the second reading detector block 9 for the reference cells.

The array 7 of reference cells is thus next to the second ramp generator RG2 and reduced in the dimensions having removed the tie of the matching of the bitlines BL.

In particular, the array 7 of reference cells has a first side in the first direction X having dimensions substantially identical to those of the size of the second detector block 9 and a second side in the second direction Y having a dimension smaller than the height of the matrix 5 of memory cells, in the example shown in the figure substantially identical to the first side in the first direction X.

Advantageously, a further embodiment of the invention schematically shown in FIG. 10 and globally indicated with 30 is proposed.

Elements being structurally and functionally identical to those described with reference to the prior art and to the architecture of FIG. 8 will be given the same reference numbers for simplifying the illustration.

The architecture 30 shows a layout similar to the architecture 10 shown in relation with the prior art and it comprises, in particular:

- a matrix 5 of memory cells;
- a row decoder 6 connected to this matrix 5 of memory cells and arranged along a first side of its own;
- an array 7 of reference cells connected to this matrix 5 of memory cells and arranged along a second side of its own, opposed to the first side;
- a first detector block 8 connected to this matrix 5 of memory cells and arranged along a third side of its own perpendicular to the first and to the second side; and
- a second detector block 9A connected to the first detector block 8 and arranged next to it in correspondence with the second side of the matrix 5 of memory cells.

In particular, the row decoder 6 comprises at least one first ramp generator RG1 connected to the cells of the matrix 5 by means of a matrix wordline WLmat, as well as a second ramp generator RG2 connected to the array 7 of reference cells by means of a reference wordline WLref.

Moreover, the detector block 8 comprises, in particular, a plurality of sense amplifiers SA1 . . . SAn connected at the input to the cells of the matrix 5 and at the output to a plurality of latch registers SAL1 . . . SALn, connected to each other by means of a references bus REF_BUS, which connects them also to a reference sense amplifier SAref contained in the second detector block 9A.

Advantageously according to this embodiment, the second detector block 9A also comprises a stabilized buffer SB connected to the references bus REF_BUS, as well as a reference latch register SALr inserted between the stabilized buffer SB and the reference sense amplifier SAref.

It is to be underlined that the second detector block 9A comprises in particular only three elements, i.e. the reference sense amplifier SAref with the corresponding reference latch register SALr as well as the stabilized buffer SB, while the detector block 8 comprises a plurality of sense amplifiers SA1 . . . SAn connected at the input to the cells of the matrix 5. The second detector block 9A thus has smaller dimensions than the detector block 8, as shown in FIG. 10.

In particular, this architecture 30 solves the problem of the accuracy of the ramp reading and verify system comprising this architecture, starting from the consideration that this accuracy can be defined as the minimum time distance between the switch of the reference sense amplifier SAref and the switch of the matrix sense amplifiers SAi, which—having a probability of one—ensures a correct interpretation of the read state for a matrix cell with respect to the one of a reference cell.

More in particular, the reading and verify operations being carried out on the basis of a time comparison, it is clear that each contribution to the switch time of one or the other sense amplifier involved in these operations can affect the accuracy of the operation itself. In reality, it is immediately verified that the fact that one of these time contributions bears or does not bear upon the accuracy of the reading or verify operation depends on the stability of the system as a whole, i.e. on how much its conditions can vary between a verify operation and a successive reading operation.

The equality or matching between a reading operation and a verify operation cannot thus be limited to ensure that the corresponding voltage ramps are identical, because that would require controlling all time contributions to these operations.

Hereafter the time contributions to the reading and verify operations will be then analyzed.

As it is well known, the transmission time of a voltage ramp along a word line WL is determined by the time constant of the word line WL itself and, therefore, it is not function of the working conditions of the memory architecture comprising this word line WL. All this is real at least until linear voltage ramps are considered, as in the considered case of ramp reading.

The switch time of the sense amplifiers involved is instead a function of the working conditions. The variations of the switch times of the matrix sense amplifiers SAi and of the reference sense amplifier SAref however compensate each other.

The time for transmitting the information of a triggering of the reference sense amplifier SAref to the matrix sense amplifiers SAi depends, in general, on the working conditions and, thus, it is not negligible.

In substance, it is possible to define a voltage margin existing between a read reference Ri and a programming verify reference Pi in the high and low queues of a programmed distribution as follows.

If a matrix cell and a reference cell respectively have thresholds equal to Vth_m and Vth_r and supposing that the reading and verify voltage ramps are identical, with slope SL, the voltage margin $M_{VH}$ in the low distribution queue is in reality smaller than the difference between the two threshold voltages, being given by the following equation:

$$M_{VH} = Vth_m - Vth_r - 2 \cdot U_{SA} + SL \cdot (T_{trans\_inf\_ref}^v - T_{trans\_inf\_ref}^r) \quad (4)$$

where:

Vth_m and Vth_r are the thresholds of the matrix and reference cells, respectively, $U_{SA}$ is the uncertainty characteristic of the sense amplifiers;

SL is the slope of the voltage ramp used; and $T_{trans\_inf\_ref}^v$ and $T_{trans\_inf\_ref}^r$ are, respectively, the transfer time of the information of the reference sense amplifier SAref to the matrix ones SAi, in the verify and reading operations.

Similarly, the voltage margin $M_{VL}$ in the low distribution queue is given by:

$$M_{VL} = Vth_r - Vth_m - 2 \cdot U_{SA} + SL \cdot (T_{trans\_inf\_ref}^r - T_{trans\_inf\_ref}^v) - V_{pgm\_step} - V_{FG\_coupling} \quad (5)$$

where:

$V_{pmg\_step}$ is the voltage difference between two subsequent programming pulses, being separated by a verify step, as applied during a programming step; and $V_{FG\_coupling}$ is the voltage value due to the capacitive coupling of the floating gate terminals of the memory cells.

Advantageously, the architecture 30 allows to void the term linked to the transfer time of the information of the reference sense amplifier SAref to the matrix ones SAi, in the verify and reading operations of the above reported equations (4) and (5), making the voltage margins $M_{VH}$ and $M_{VL}$ equal to:

$$M_{VH}=Vth_m-Vth_r-2\cdot U_{SA} \qquad (4')$$

$$M_{VL}=Vth_r-Vth_m-2\cdot U_{SA}-V_{pgm\_step}-V_{FG\_coupling} \qquad (5')$$

In particular, the architecture 30 shown in FIG. 10 allows to void this term making the time contributions due to the transfer of the triggering information of the reference sense amplifier SAref identical to the matrix ones SAi.

Figure 11A:
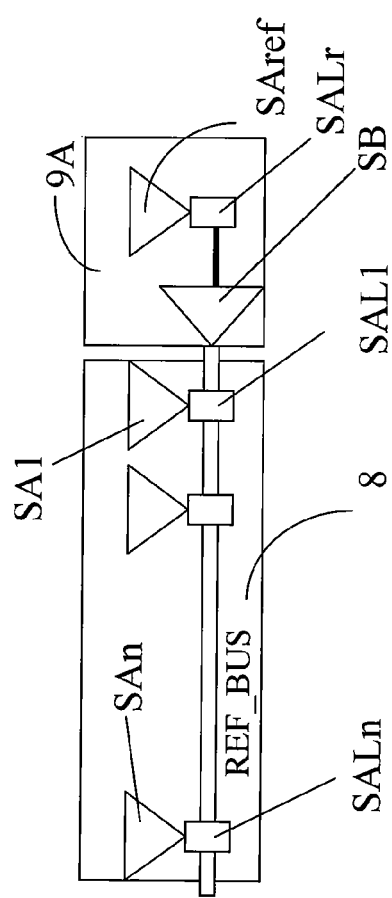
FIG. 11A schematically shows a detail of the second embodiment of the architecture of FIG. 8.

Advantageously, the architecture 30 thus provides that the references bus REF_BUS transporting the information of the occurred triggering of the reference sense amplifier SAref is driven by means of the stabilized buffer SB, as shown in FIG. 11A. In particular, the stabilized buffer SB supplies an output signal with rise transient being stable with respect to the working conditions of the architecture 30, in particular independent from supply voltage and working temperature of this architecture 30.

It is obviously possible to integrate the measures of the architectures 20 and 30 by placing the array 7 of reference cells between the row decoder 6 and the matrix 5 and by further using a stabilized buffer SB connected to the reference sense amplifier SAref. Similarly, it is possible to integrate the measures of the architectures 20' and 30 by placing the array 7 of reference cells at the beginning of the reference wordline WLref, in correspondence with the first side of the matrix 5 of memory cells between the row decoder 6 and the second reading detector block 9 for the reference cells, this second detector block 9 further comprising a stabilized buffer SB connected to the reference sense amplifier SAref.

Figure 12A:
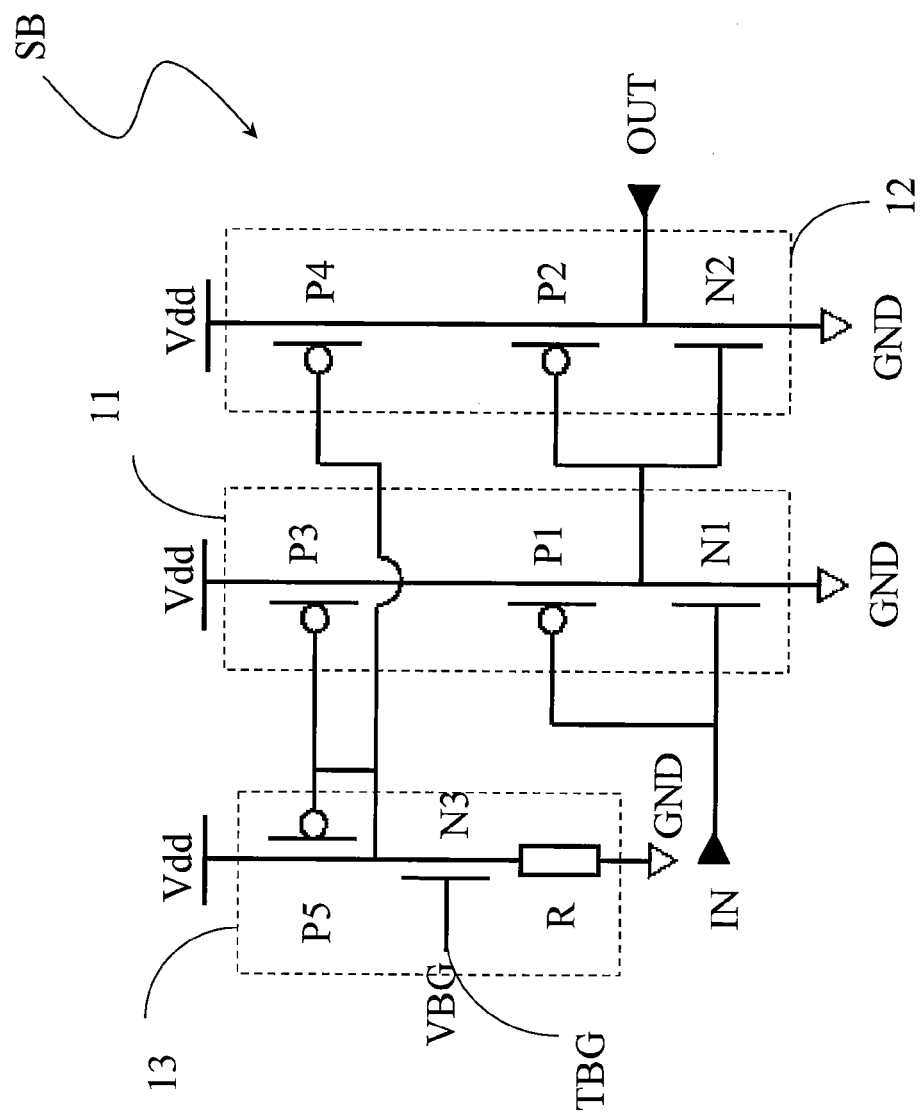
FIGS. 12A-12B schematically show possible implementations of the detail of FIG. 11A.

A stabilized buffer SB realized according to an embodiment of the present invention is shown in FIG. 12A.

This stabilized buffer SB is inserted between a first and a second voltage reference, in particular a supply voltage Vdd and a ground GND, and it comprises at least one input branch 11 and one output branch 12 inserted between these supply Vdd and ground GND voltage references and connected, in cascade to each other, between an input terminal IN and an output terminal OUT of the stabilized buffer SB.

The stabilized buffer SB also comprises a stabilization branch 13, inserted between the supply Vdd and ground GND voltage references, connected to a reference terminal TBG as well as to those input and output terminals, 11 and 12.

In particular, the input branch 11 comprises a first PMOS transistor P1 and a first NMOS transistor N1, having respective control or gate terminals connected to each other and to the input terminal IN and first conduction terminals, in particular drain terminals, connected to each other and to control or gate terminals of a second PMOS transistor P2 and of a second NMOS transistor N2 of the output branch 12, having in turn first conduction terminals, in particular drain terminals, connected to each other and to the output terminal OUT.

Moreover, the first PMOS transistor P1 has a second conduction terminal connected, by means of a third PMOS transistor P3 to the supply voltage reference Vdd and the first NMOS transistor N1 has a second conduction terminal connected to the ground GND.

Similarly, the second PMOS transistor P2 has a second conduction terminal connected, by means of a fourth PMOS transistor P4 to the supply voltage reference Vdd and the second NMOS transistor N2 has a second conduction terminal connected to the ground GND.

Further, the stabilization branch 13 comprises a fifth PMOS transistor P5, a third NMOS transistor N3, and a resistor R inserted, in series with each other, between the supply voltage reference Vdd and the ground GND.

In particular, the third NMOS transistor N3 has a control or gate terminal connected to the reference terminal TBG and receiving therefrom a reference voltage VBG, in particular a band gap voltage, while the fifth PMOS transistor P5 has a control or gate terminal connected to its first conduction, or drain, terminal as well as to the gate terminals of the third and fourth PMOS transistors, P3 and P4.

In this way, it is immediate to verify that the rise transient of the signal on the output terminal OUT of the stabilized buffer SB depends on the current locally generated by the resistive element R and by the fifth PMOS transistor being diode-wise connected, P5, inserted in the stabilization branch 13.

Advantageously according to this embodiment, the stabilized buffer SB thus obtained has a dependence to the supply voltage Vdd and to the temperature being really reduced with respect to the known solutions.

Figure 12B:
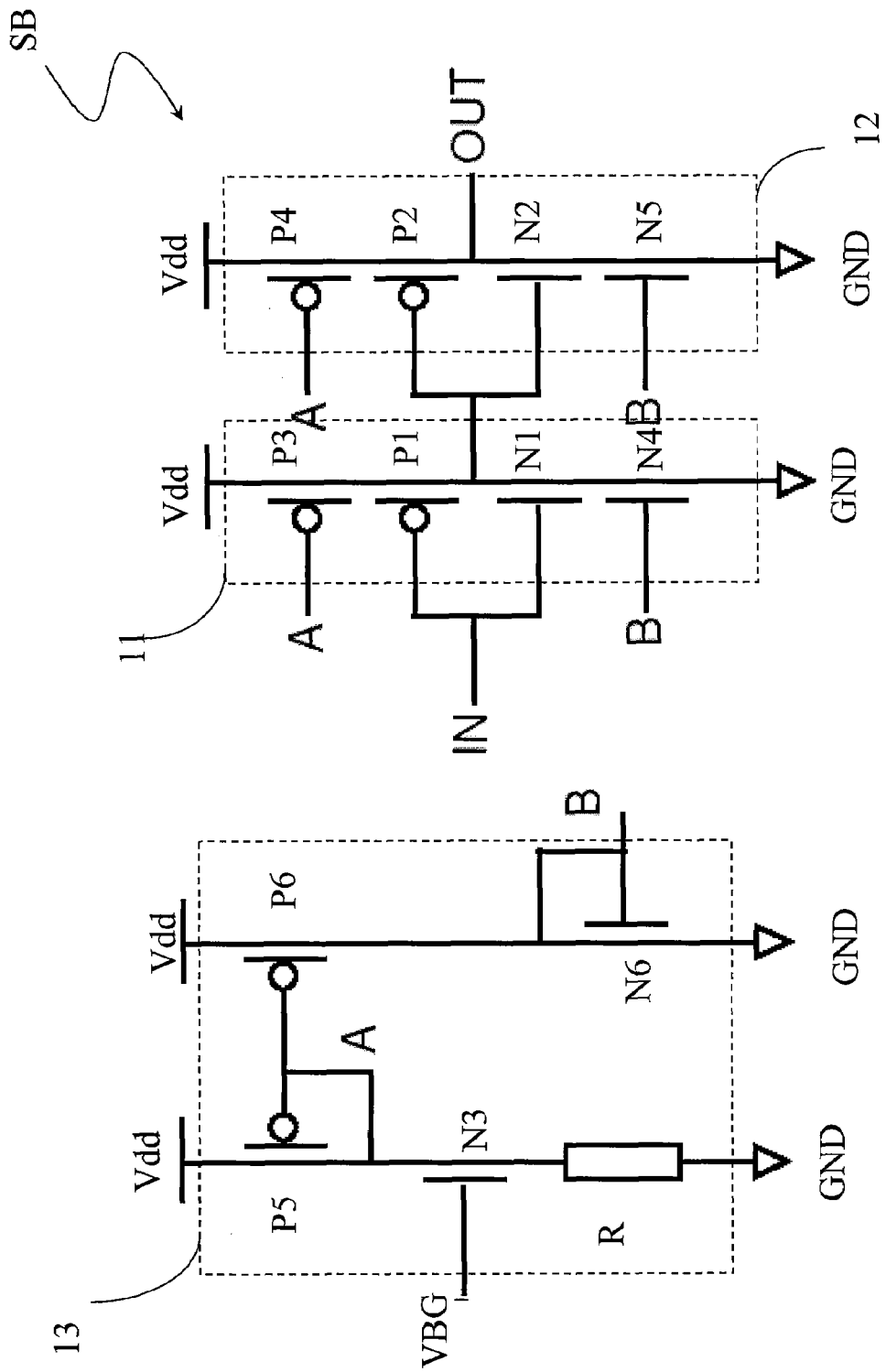

It is also possible to realize the stabilized buffer SB as schematically shown in FIG. 12B.

In this case, the input branch 11 comprises, besides the first PMOS transistor P1, the first NMOS transistor N1 and the third PMOS transistor P3, a further fourth MOS transistor of the N type, N4, inserted between the second conduction terminal of the first NMOS transistor N1 and ground GND.

Similarly, the output branch 12 comprises, besides the second PMOS transistor P2, the second NMOS transistor N2 and the fourth PMOS transistor P4, a further fifth MOS transistor of the N type, N5, inserted between the second conduction terminal of the second NMOS transistor N2 and ground GND.

Moreover, the stabilization branch 13 comprises, besides the fifth PMOS transistor P5, the third NMOS transistor N3 and the resistor R, a further sixth MOS transistor of the P type, P6, and a further sixth MOS transistor of the N type, N6, inserted, in series with each other, between the supply voltage reference Vdd and ground GND.

In particular, the sixth PMOS transistor P6 has a control or gate terminal connected to the gate terminal of the fifth PMOS transistor P5 in correspondence with a first node A. Moreover, the control or gate terminals of the fourth, fifth and sixth NMOS transistors, N4, N5 and N6, are connected to each other and to a first conduction or drain terminal of the sixth NMOS transistor N6 in correspondence with a second node B.

Advantageously according to this embodiment, the stabilized buffer SB thus obtained has an enhanced stability since both signal edges are controlled, being provided to the input of the input and output branches, 11 and 12, which work as inverters.

Figure 11B:
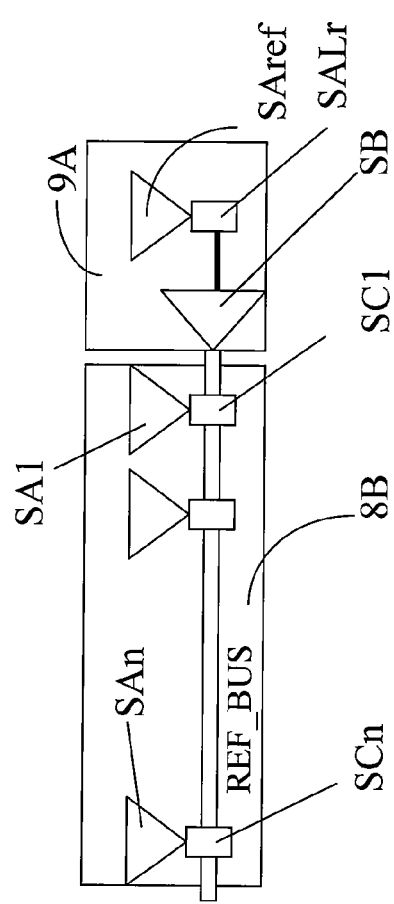
FIG. 11B schematically shows a detail of a third embodiment of the architecture of FIG. 8.

According to a further embodiment of the architecture 30 also the latch registers connected to the matrix sense amplifiers SAi are controlled by the references bus REF_BUS, as schematically shown in FIG. 11 B, where these controlled latch registers are indicated as SC1 . . . SCn.

In this way, the architecture 30 allows to control both the information transmitter and receiver side of the occurred triggering of the reference sense amplifier SAref.

Figures 13A, 13B:
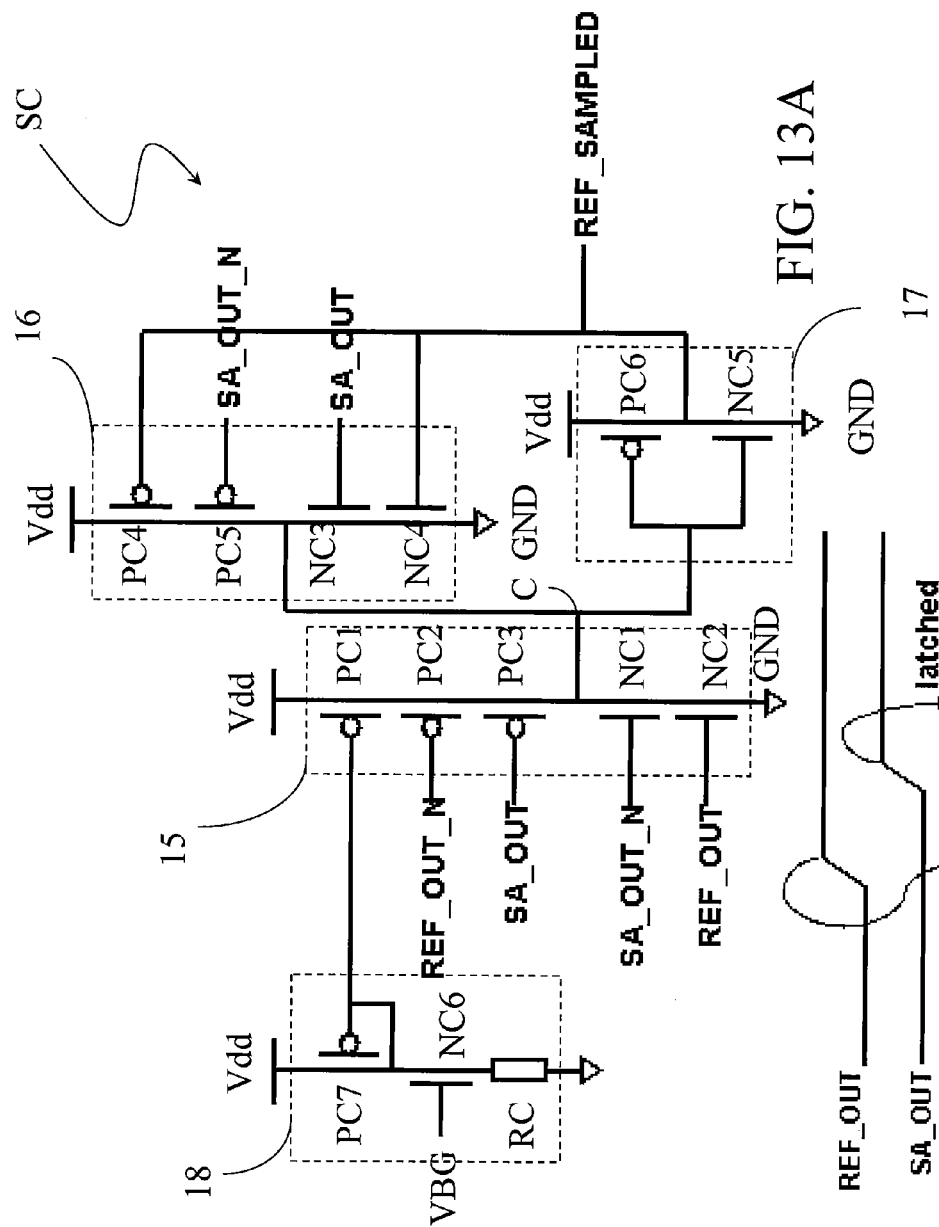
FIG. 13A schematically shows a possible implementation of the detail of FIG. 11B.
FIG. 13B schematically shows the pattern of the inner signals of the detail of FIG. 13A.

A possible implementation of a controlled latch register SC according to the invention is schematically shown in FIG. 13A.

In particular, the controlled latch register SC comprises an input stage 15 in turn including a first PC1, a second PC2 and a third PMOS transistor PC3, inserted, in series with each other, between the supply voltage reference Vdd and an inner circuit node C, as well as a first NC1 and a second NMOS transistor NC2 inserted, in series with each other, between the inner circuit node C and the ground GND.

The controlled latch register SC also comprises a first output stage 16 in turn including a fourth PC4 and a fifth PMOS transistor PC5, inserted, in series with each other, between the supply voltage reference Vdd and the inner circuit node C, as well as a third NC3 and a fourth NMOS transistor NC4 inserted, in series with each other, between the inner circuit node C and ground GND, as well as a second output stage 17 in turn including a sixth PMOS transistor PC6 and a fifth NMOS transistor NC5, inserted, in series with each other, between the supply voltage reference Vdd and the ground GND and having respective control or gate terminals connected to each other and to the inner circuit node C.

In particular, the third PMOS transistor PC3 of the input stage 15 and the third NMOS transistor NC3 of the first output stage 16 have respective control or gate terminals receiving a first control signal, SA_OUT, corresponding to an output signal from the matrix sense amplifiers SAi, while the first NMOS transistor NC1 of the input stage 15 and the fifth PMOS transistor PC5 of the first output stage 16 have respective control or gate terminals receiving a denied value SA_OUT_N of this first control signal, SA_OUT. Moreover, the second NMOS transistor NC2 and the second PMOS transistor PC2 of the input stage 15 have respective control or gate terminals receiving a second control signal, REF_OUT and a denied value thereof REF_OUT_N, this second control signal REF_OUT corresponding to an output signal from the reference sense amplifier SAref.

The controlled latch register SC also comprises a stabilization stage 18 in turn including a seventh PMOS transistor PC7, a sixth NMOS transistor NC6 and a resistor RC inserted, in series with each other, between the supply voltage reference Vdd and ground GND. In particular, the sixth NMOS transistor NC6 has a control or gate terminal receiving a reference voltage, in particular a band gap voltage, VGB, while the seventh PMOS transistor PC7 is diode-configured and has a control or gate terminal connected, in mirror configuration, to a control or gate terminal of the first PMOS transistor PC1 of the input stage 15.

Finally, the control or gate terminals of the fourth PMOS transistor PC4 and of the fourth NMOS transistor NC4 of the first output stage 16, as well as of common conduction terminals of the sixth PMOS transistor PC6 and of the fifth NMOS transistor NC5 of the second output stage 17 are connected to a reference output terminal REF_SAMPLED.

As it can be observed from a simple circuit analysis shown in FIG. 13B, the current generated by the sixth NMOS transistor N6 of the stabilization stage 18 being connected to the band gap voltage VBG—i.e. at a stable voltage when the supply voltage and the temperature vary—and the current flowing through it being mirrored in the PMOS side of the input stage 15, the triggering threshold of the controlled latch register SC is advantageously stabilized when the supply voltage and the temperature vary.

Figure 14:
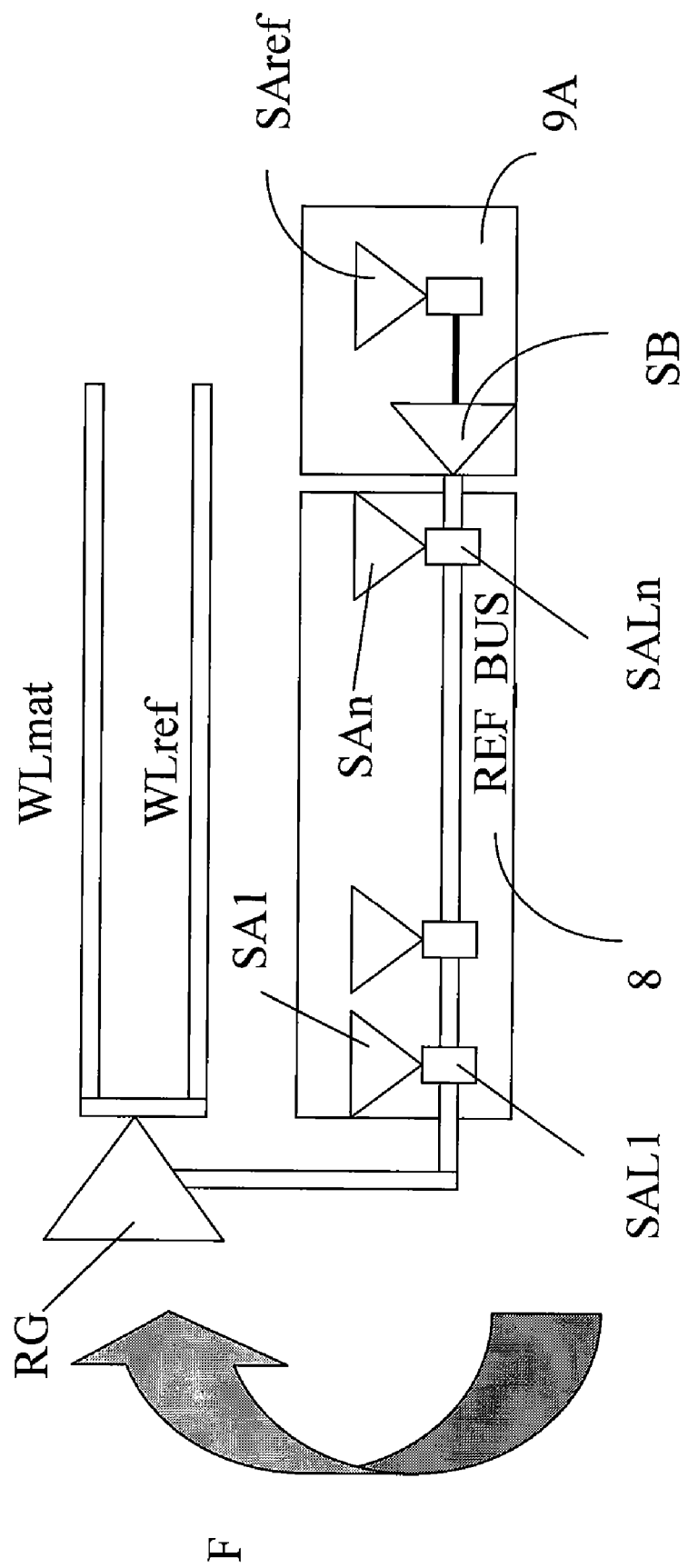
FIG. 14 schematically shows the operation of the third embodiment of the architecture of FIG. 8.

It is also suitable to note that, in the systems with ramp reading, the triggering of the third read reference R3 closes the reading itself turning off the ramp generator and activates the discharge of the word line WL, as schematically shown in FIG. 14 by means of the arrow F. It is thus clear that by stabilizing the buffers of all the references, and thus also that of the third read reference, it is possible to stabilize also the turn-off mechanism shown and, definitively, the access time of the system as a whole.

In substance, the architecture 30 of FIG. 10, provided with the stabilized buffer SB and possibly with the controlled latch registers SC, minimizes the variability of the reading and verify system accuracy when the working conditions vary. In this way, it is possible to optimize the choice of the voltage margins between the various distributions, the ramp reading system being, as whole, more stable.

In conclusion, the proposed architectures of non-volatile memory devices have one or more of the following advantages:

greater control of the level of the reading and programming references;

greater stability of the access time in reading;

reduction or voiding of the contribution time to the access time due to the references;

reduction of the mismatch between reading and verify operations, through the use of short wordlines, subsequent choice of short reference bitlines BL for the area reduction;

optimization of the matching between reading voltage ramp and verify voltage ramp having a single wordline of the references; and minimization of the variability of the accuracy of the reading and verify system when the working conditions vary.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory architecture, comprising:
a matrix of memory cells structured into rows and columns of cells and including wordlines;
a row decoder associated with the matrix;
an array of reference cells associated with the matrix;
a first detector block for the memory cells, the first detector block including a plurality of sense amplifiers associated with the matrix of memory cells in correspondence with its columns, as well as a plurality of latch registers connected to outputs of the sense amplifiers, respectively;
a references bus interconnecting the latch registers;
a second detector block for the reference cells, the second detector block being connected to the latch registers by the references bus and including at least one sense amplifier of the reference cells, wherein the second detector block further comprises a stabilized buffer to supply the bus with an output signal with a rise transient that is stable with respect to working conditions of the architecture; and wherein the array of reference cells is connected upstream of the wordlines of the matrix taking as reference a propagation direction of a voltage signal applied to at least one of the memory cells.

2. The memory architecture of claim 1, wherein the array of reference cells is interposed between the row decoder and the matrix of memory cells.

3. The memory architecture of claim 1, wherein the row decoder comprises at least one first ramp generator connected to the rows of the matrix of memory cells.

4. The memory architecture of claim 3, comprising at least one second ramp generator connected to the reference cells.

5. The memory architecture of claim 4, wherein the array of reference cells is placed next to the second ramp generator.

6. The memory architecture of claim 4, wherein the row decoder includes the at least one second ramp generator.

7. The memory architecture of claim 5, wherein the array of reference cells is placed next to the ramp generators.

8. The memory architecture of claim 1, wherein the array of reference cells has a first side having a dimension substantially identical to a width of the second detector block.

9. The memory architecture of claim 8, wherein the array of reference cells has a second side having smaller dimensions than a height of the matrix of memory cells.

10. The memory architecture of claim 8, wherein the array of reference cells has a second side having a dimension substantially identical to a height of the matrix of memory cells.

11. The memory architecture of claim 1, wherein the second detector block for the reference cells has a first side having a dimension substantially identical to a width of the array of reference cells and a second side having a dimension substantially identical to a width of the first detector block for the matrix cells.

12. The memory architecture of claim 1, wherein the memory cells are multilevel non-volatile memory cells.

13. The memory architecture of claim 1, wherein the matrix of memory cells is a Flash-NOR memory matrix.

14. The memory architecture of claim 1, wherein the second detector block further comprises a reference latch register inserted between the stabilized buffer and the sense amplifier of the reference cells.

15. The memory architecture of claim 14, wherein the stabilized buffer drives, by the output signal, the references bus which transports information of an occurred triggering of the sense amplifier of the reference cells.

16. The memory architecture of claim 1, wherein the stabilized buffer is inserted between a first and a second voltage reference and comprises:
- an input branch and an output branch inserted between the first and second voltage references and connected, in cascade to each other, between an input terminal and an output terminal of the stabilized buffer; and
- a stabilization branch inserted between the first and second voltage references and connected to a reference terminal as well as to the input and output branches, the reference terminal receiving a band gap reference voltage,
- the input branch comprising a first PMOS transistor and a first NMOS transistor, having respective control terminals connected to each other and to the input terminal of the stabilized buffer,
- the output branch comprising a second PMOS transistor and a second NMOS transistor, having respective first conduction terminals connected to each other and to the output terminal of the stabilized buffer,
- the first PMOS and first NMOS transistors of the input branch having first conduction terminals connected to each other and to control terminals of the second PMOS and second NMOS transistors of the output branch,
- the first and second PMOS transistors of the input and output branches having second conduction terminals connected, through respective third and fourth PMOS transistors, to the first voltage reference, while the first and second NMOS transistors of the input and output branches have second conduction terminals connected to the second voltage reference,
- the stabilization branch comprising a fifth PMOS transistor, a third NMOS transistor, and a resistor inserted, in series with each other, between the first and second voltage references,
- the third NMOS transistor having a control terminal connected to the reference terminal and receiving therefrom the band gap reference voltage, while the fifth PMOS transistor has a control terminal connected to its first conduction terminal, as well as to the control terminals of the third and fourth PMOS transistors of the input and output branches.

17. The memory architecture of claim 16, wherein:
- the input branch further comprises a fourth NMOS transistor inserted between the second conduction terminal of the first NMOS transistor and the second voltage reference,
- the output branch further comprises a fifth NMOS transistor, inserted between the second conduction terminal of the second NMOS transistor and the second voltage reference, and
- the stabilization branch further comprises a sixth PMOS transistor, and a sixth NMOS transistor, inserted, in series with each other, between the first and second voltage references,
- the sixth PMOS transistor having a control terminal connected to control terminal of the fifth PMOS transistor in correspondence with a first node, and
- the fourth, fifth and sixth NMOS transistors having respective control terminals connected to each other and to a first conduction terminal of the sixth NMOS transistor in correspondence with a second node.

18. The memory architecture of claim 1, wherein the first detector block for the matrix cells comprises a plurality of latch registers controlled by the references bus.

19. The memory architecture of claim 18, wherein each of these controlled latch registers comprises:
- an input stage including first, second and third PMOS transistors and first and second NMOS transistors, the PMOS transistors being connected in series with each other between a first voltage reference and an inner circuit node, and the NMOS transistors being connected in series with each other between the inner circuit node and a second voltage reference;
- a first output stage including fourth and fifth PMOS transistors and third and fourth NMOS transistors, the fourth and fifth PMOS transistors being connected in series with each other between the first voltage reference and the inner circuit node, and the third and fourth NMOS transistors being connected in series with each other between the inner circuit node and the second voltage reference;
- a second output stage including a sixth PMOS transistor and a fifth NMOS transistor connected in series with each other between the first and second voltage references and having respective control terminals connected to each other and to the inner circuit node; and
- a stabilization stage including a seventh PMOS transistor, a sixth NMOS transistor, and a resistor connected in series with each other between the first and second voltage references.

20. The memory architecture of claim 19, wherein:
- the third PMOS transistor and the third NMOS transistor have respective control terminals receiving a first control signal, corresponding to an output signal from the plurality of sense amplifiers;
- the first NMOS transistor and the fifth PMOS transistor have respective control terminals receiving a denied value of the first control signal;
- the second NMOS transistor and the second PMOS transistor have respective control terminals respectively receiving a second control signal and a denied value thereof, the second control signal corresponding to an output signal from the sense amplifier of the reference cells;

the seventh PMOS transistor is diode-configured and has a control terminal connected, in mirror configuration, to a control terminal of the first PMOS transistor; and control terminals of the fourth NMOS and fourth PMOS transistors and conduction terminals of the sixth PMOS transistor and of the fifth NMOS transistor are connected to a reference output terminal.

21. The memory architecture of claim 1, wherein the first detector block for the matrix cells comprises a plurality of latch registers controlled by the references bus.

22. The memory architecture of claim 21, wherein each of these controlled latch registers comprises:

an input stage including first, second and third PMOS transistors and first and second NMOS transistors, the PMOS transistors being connected in series with each other between a first voltage reference and an inner circuit node, and the first and second NMOS transistors being connected in series with each other between the inner circuit node and a second voltage reference;

a first output stage including fourth and fifth PMOS transistors and third and fourth NMOS transistors, the fourth and fifth PMOS transistors being connected in series with each other between the first voltage reference and the inner circuit node, and the third and a fourth NMOS transistors being connected in series with each other between the inner circuit node and the second voltage reference;

a second output stage including a sixth PMOS transistor and a fifth NMOS transistor connected in series with each other between the first and second voltage references and having respective control terminals connected to each other and to the inner circuit node; and a stabilization stage including a seventh PMOS transistor, a sixth NMOS transistor, and a resistor connected in series with each other between the first and second voltage references.

23. The memory architecture of claim 22, wherein:

the third PMOS transistor of the input stage and the third NMOS transistor of the first output stage have respective control terminals receiving a first control signal, corresponding to an output signal from the plurality of sense amplifiers;

the first NMOS transistor of the input stage and the fifth PMOS transistor of the first output stage have respective control terminals receiving a denied value of the first control signal;

the second NMOS transistor and the second PMOS transistor of the input stage have respective control terminals respectively receiving a second control signal and a denied value thereof, the second control signal corresponding to an output signal from the sense amplifier of the reference cells;

the seventh PMOS transistor of the stabilization stage is diode-configured and has a control terminal connected, in mirror configuration, to a control terminal of the first PMOS transistor of the input stage; and control terminals of the fourth transistors of the first output stage, as well as common conduction terminals of the sixth PMOS transistor and of the fifth NMOS transistor of the second output stage are connected to a reference output terminal.

* * * * *